United States Patent [19]

Ostrem

[11] Patent Number: 5,726,861
[45] Date of Patent: Mar. 10, 1998

[54] SURFACE MOUNT COMPONENT HEIGHT CONTROL

[76] Inventor: Fred E. Ostrem, 3463 R.F.D., Long Grove, Ill. 60047

[21] Appl. No.: 367,967

[22] Filed: Jan. 3, 1995

[51] Int. Cl.⁶ .................................................. H05K 7/02
[52] U.S. Cl. ...................... 361/767; 174/260; 174/261; 228/180.22; 257/724; 361/760; 361/768; 361/771; 361/777; 361/779; 361/782; 361/783; 439/68; 439/83
[58] Field of Search .................. 174/261, 260, 174/263; 228/180.21, 180.22; 257/778, 712, 779, 723, 724, 725; 361/760, 772, 767, 768, 773, 774, 777, 779, 782, 783, 771; 439/68, 71, 83; 437/209, 71

[56] References Cited

U.S. PATENT DOCUMENTS

| | | | |
|---|---|---|---|
| 4,545,610 | 10/1985 | Lakritz et al. | 174/263 |
| 5,173,670 | 12/1992 | Naito et al. | 361/782 |
| 5,266,748 | 11/1993 | Kawakami et al. | 361/767 |

FOREIGN PATENT DOCUMENTS

| | | | |
|---|---|---|---|
| 55-43811 | 3/1980 | Japan | 437/209 |
| 61-159745 | 7/1986 | Japan | 437/209 |
| 62-150837 | 7/1987 | Japan | 257/712 |
| 2032190 | 4/1980 | United Kingdom | 437/71 |

OTHER PUBLICATIONS

IBM Tech. Discl. Bulletin "Chip Mounting With Prestretched Joints" by V.D. Coombs vol. 16 No. 3 p. 767 Aug. 1973.

IBM Tech. Discl. Bul. "Chip With Lengthened Solder Joints Using Shape Memory Alloy" vol. 29 No. 12 p. 5213 May 1987.

IBM Tech. Discl. Bul. "Pin Support For IC Chip To Prevent CA Collapse During Reflow" vol. 30 No. 11 p. 320 Apr. 1988.

IBM Tech. Discl. Bul. "Circuit Board Stand–off To Reduce Thermal Fatigue" vol. 31 No. 9. p. 438 Feb. 1989.

IBM Tech. Discl. Bul. "Process For Forming A High–Aspect-Ratio Solder Interconnection" vol. 32 No. 6B p. 180 Nov. 1985.

Primary Examiner—Donald Sparks
Attorney, Agent, or Firm—Nicholas C. Hopman

[57] ABSTRACT

A method and structure for controlling solder height of a surface mount device on a substrate uses electrical connection pads (105, 105') disposed onto a substrate (101). A height control pad (111) is also disposed onto the substrate (101) positioned apart from the electrical connection pads (105, 105'). Solder fillets (107, 107', 113) are disposed onto both the electrical connection pads (105, 105') and the height control pad (111). A component (103) having an electrical termination portion (109, 109') in contact with the solder fillets (107, 107') associated with the electrical connection pads (105, 105') and a body portion (115) in contact with the solder fillet (113) associated with the height control pad (111). The resulting structure (100 has a height relationship (119) between the surface mount component (103) and the substrate (101) controlled principally by a quantity of solder in the electrically conductive solder fillet (113) is disposed onto the height control copper pad (111) and a geometry of the copper pads (105) and (105') and the height control copper pad (111).

3 Claims, 2 Drawing Sheets

SURFACE MOUNT COMPONENT HEIGHT CONTROL

FIELD OF THE INVENTION

This invention is generally directed to the field of electronic assemblies, and specifically for controlling a soldered captivation structure of a surface mount device.

BACKGROUND OF THE INVENTION

Contemporary electronic assemblies often use a substrate to captivate many discrete electrical components via soldered connections. This includes both leaded and surface mount type components. Control of the manufacturing variance in the soldered captivation structure is particularly important when considering field reliability of an electronic assembly because solder joints can fatigue and also cause fatigue to the captivated component—ultimately causing it to fail. For example, in a two leaded component such as a surface mounted resistor, if mounted on a printed circuit board, thermal excursions cause stress in the solder and the surface mounted resistor because of a difference in thermal expansion behavior between the printed circuit board and the surface mounted resistor. For a low solder height, between the surface mounted resistor and the printed circuit board, the solder stress is high which results in a low cycle-life. For a high solder height, between the surface mounted resistor and the printed circuit board, the solder stress is reduced and the structure can survive many cycles. So, mindful of component and solder-joint longevity, the surface mounted resistor should be captivated with a closely controlled solder height and as uniform as possible.

In traditional through-hole substrate designs solder height is not a factor because the components are soldered via a leaded structure that provides a flexible interface between the component and the substrate necessary for component longevity. However, in a surface mount design there are no leads and no mechanism to control the uniformity and height of the soldered connection.

Furthermore, the surface tension of the solder at the termination ends and the weight of the component tend to reduce solder height to 1.0 mil or less which produces high stress which reduces the fatigue life. This is also the case with captivation of components having many leads—such as an integrated leadless carrier.

What is needed is a simple structure and/or method for controlling the height between a surface mounted component and a substrate to increase the fatigue life of the soldered structure and the surface mounted component.

DETAILED DESCRIPTION OF A PREFERRED EMBODIMENT

A method and structure for controlling the height of solder under a surface mount device on a substrate uses an electrical connection pad disposed onto a substrate. A height control pad is also disposed onto the substrate positioned apart from the electrical connection pad. Solder fillets are disposed onto both the electrical connection pad and the height control pad. A component having an electrical termination portion in contact with the solder fillet associated with the electrical connection pad and a body portion in contact with the solder fillet associated with the height control pad.

Figure 1:
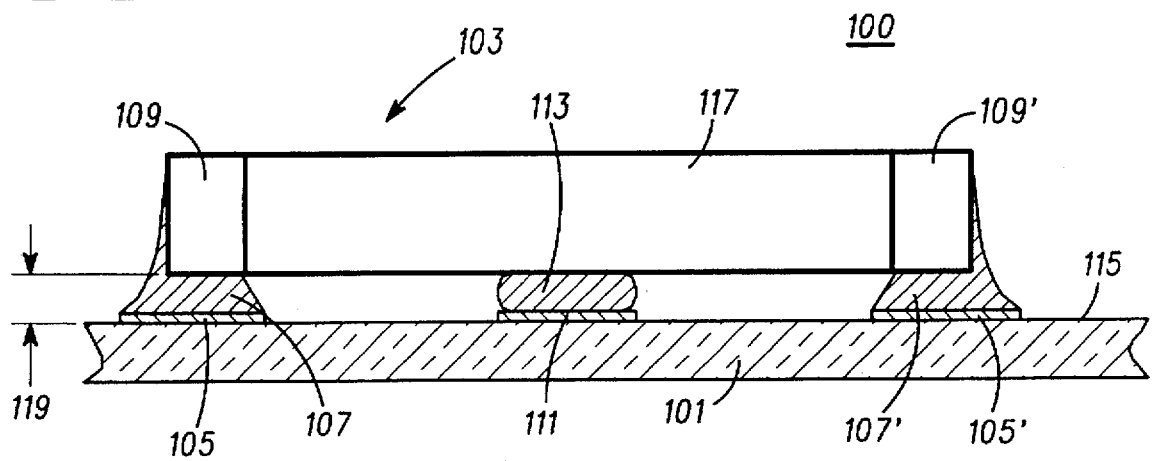
FIG. 1 is a schematic drawing of a structure for surface mount component height control in accordance with a preferred embodiment of the invention.

In FIG. 1 a structure 100 comprises a substrate 101 with a surface mount component 103 attached to it. The substrate 101 may be any conventional substrate material such as epoxy based printed circuit board, a polyimide based flexible circuit, or a alumina based substrate to name a few. The structure 100 includes copper pads 105 and 105' disposed onto a first surface 115 of a substrate 101 with electrically conductive solder fillets 107 and 107' coupled to termination pads 109 and 109'. The structure 100 also includes a height control copper pad 111 disposed positioned between the copper pads 105 and 105' and under a body portion 117 of the surface mount component 103. An electrically conductive solder fillet 113 is disposed onto the height control copper pad 111. This structure has a height relationship 119 between the surface mount component 103 and the substrate 101 controlled principally by the quantity of solder in the electrically conductive solder fillet 113 disposed onto the height control copper pad 111, the geometry of the copper pads 105 and 105', and the height control copper pad 111.

Figure 2:
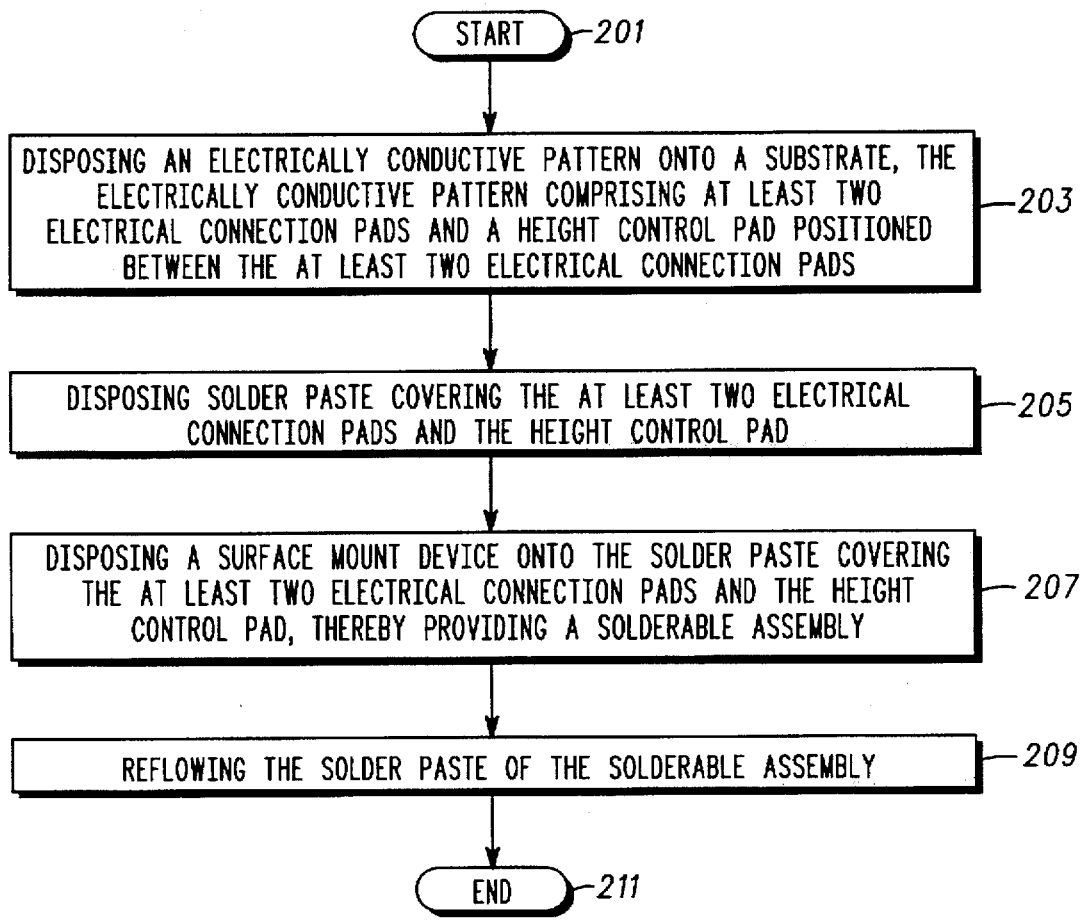
FIG. 2 is a method flow chart describing a method embodiment of the inventive structure introduced in FIG. 1.

Next, a method embodiment is illustrated in FIG. 2. The method proceeds with a start step 201.

Next, in step 203 an electrically conductive pattern is disposed onto a substrate. The electrically conductive pattern comprises at least two electrical connection pads and a height control pad or pads positioned between the at least two electrical connection pads. Typically, in a printed circuit board substrate application, a solderable copper based pattern, or the at least two electrical connection pads and a height control pad, is imprinted on a printed circuit board using a conventional photolithographic process. Note that another useful pattern includes an integrated circuit pattern as shown and detailed later in FIG. 3. Preferably, the height control pad or pads are positioned between any electrical connection pads of the component that will later be attached via a soldering process.

Then, in step 205, solder paste is disposed covering the at least two electrical connection pads and the height control pad. Again, this can be done by any conventional process such as silk-screening or stenciling.

Next, in step 207, a surface mount device is disposed onto the disposed solder paste. The surface mount device, or component, has electrical termination portions and a body portion as shown in FIG. 1. The electrical termination portions—here end caps of a resistor are positioned onto the solder paste disposed covering the at least two electrical connection pads. The body portion of the surface mount device is positioned onto the height control pad or pads. This step, 207, provides a solderable assembly.

Then, in step 209, the disposed solder paste is reflowed under heat. This step causes the solder to melt and flow. In the liquidus state the solder paste associated with the height control pad or pads attempts to form in a hemispherical shape while a weight of the surface mount device and the surface tension at the electrical termination portions tend to flatten the solder paste. A final height, between the surface mount device and the printed circuit board, is determined principally by the solder pad size of the height control pad or pads, the surface tension of the liquidus solder, and the amount of solder paste deposited onto the height control pad or pads. When the solder cools down to form a solid structure the two electrical connection pads are bonded by the solder paste to the electrical termination portions of the surface mount device. Also, when the portion of solder paste disposed onto the height control pad cools down to a solid structure it maintains the height established in the liquidus stage. The process is ended at step 211.

Figure 3:
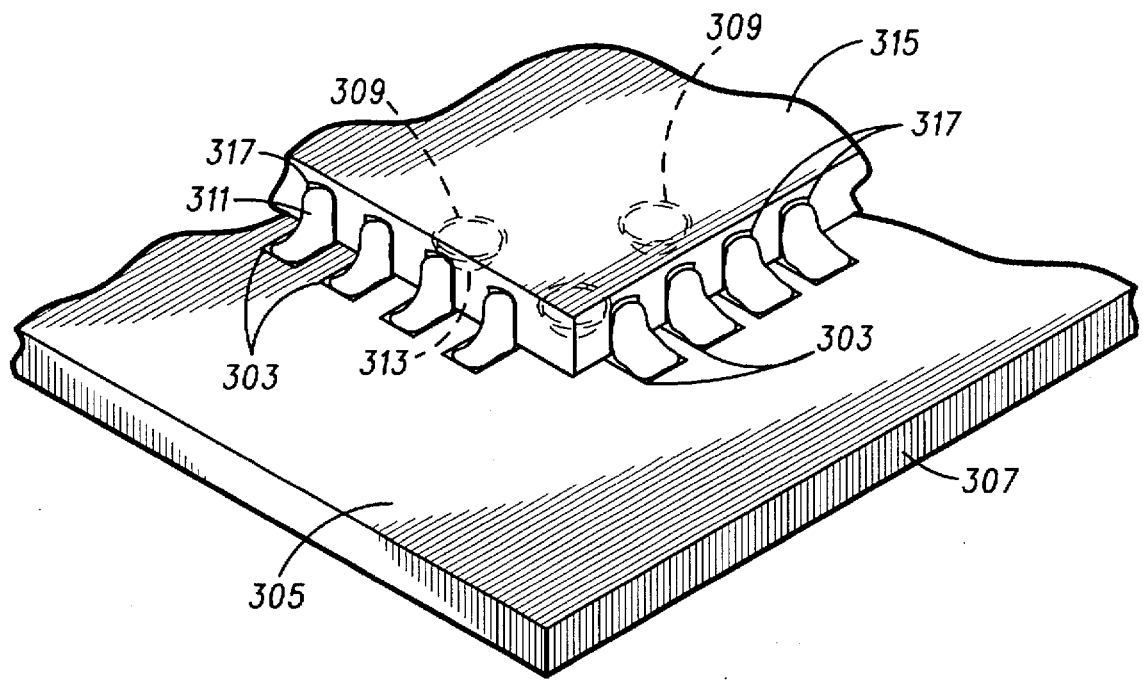
FIG. 3 is a schematic drawing of an alternative embodiment of the inventive structure introduced in FIG. 1.

An alternative structural embodiment is illustrated in FIG. 3 for an integrated circuit surface mount component 301. In this example a plurality of electrical connection pads 303 are disposed apart on a first surface 305 of a substrate 307.

A height control pads 309 are also disposed onto the first surface 305 of the substrate 307. The height control pads 309 are positioned between the plurality of electrical connection pads 303.

Solder fillets 311, 313 are disposed onto each of the plurality of electrical connection pads 303 and the height control pad 309.

The surface mount device, here a leadless chip carrier, has a body portion 315 and a plurality of terminations 317. These terminations 317 are commonly known as castellations and typically tale the form of plated indentations on the body portion 315 of the leadless chip carrier. The plurality of terminations 317 are coupled to the solder fillets 311 associated with the plurality of electrical connection pads 303, and the body portion 315 is coupled to the solder fillet 313 associated with the height control pad 309. Although the embodiment in FIG. 1 shows a two terminal surface mount device and the embodiment in FIG. 3 shows an integrated circuit device other devices can be mounted and their height controlled via the above-detailed structure and method steps.

For example structures such as surface mount filters, capacitors, and resonators can use the described method to build the described structure to improve their solder connection fatigue life.

Figure 4:
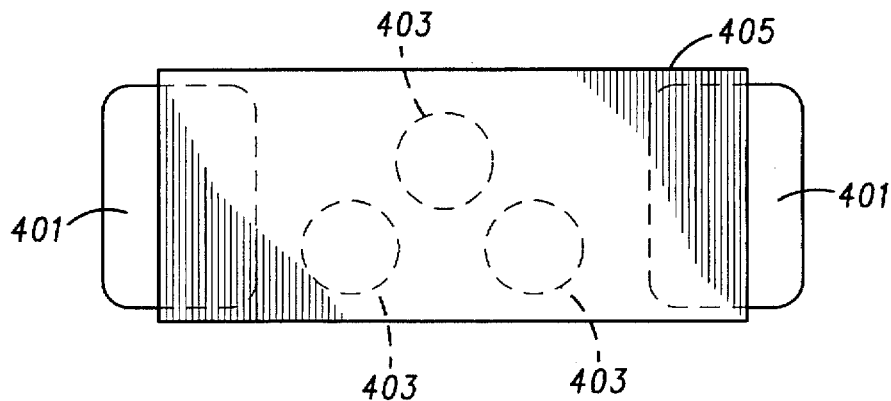
FIG. 4 is a schematic drawing of another alternative embodiment of the inventive structure introduced in FIG. 1.

In FIG. 4 another alternative embodiment of the inventive structure introduced in FIG. 1 is illustrated. In this embodiment a two termination component 405 is captivated by solder applied to two electrically conductive pads 401. Height of this component 405 is controlled via multiple height control pads 403.

Preferably, the height control pad is positioned at a center of gravity of the component, and the height control pad is electrically isolated from the electrical connection pads connected to the component's leads.

In conclusion, the preferred embodiment details a method and a structure for controlling the height of a solder structure beneath a surface mount device on a substrate. This method and structure is particularly useful because it uses conventional assembly process and equipment in a new way. This method and resultant structure results in maximizing the fatigue life of the surface mount component soldered connection by providing a compliant interconnect that can withstand repeated thermal excursions.

What is claimed is:

1. A circuit assembly comprising a surface mount device on a substrate, the assembly comprising:

a pair of electrical connection pads disposed onto a first surface of the substrate;

a solderable height control pad disposed onto the first surface of the substrate positioned between the two electrical connection pads;

solder fillets soldered onto each of the two electrical connection pads and the height control pad; and a component having two opposing ends with an electrical termination portion located at each of the two ends, and a non-solderable body portion, wherein the two electrical termination portions extend from a surface on each of the two opposing ends to a surface on a bottom portion of the component, and wherein each of the surfaces of the two electrical termination portions are bonded to the solder fillet associated with a corresponding one of the pair of electrical connection pads, and the non-solderable body portion is resting on the solder fillet associated with the height control pad.

2. A circuit assembly in accordance with claim 1 wherein the component has a center of gravity and wherein the height control pad is positioned at the center of gravity of the component.

3. A circuit assembly in accordance with claim 1 wherein the height control pad is electrically isolated from the pair of electrical connection pads.

* * * * *